US012543270B2

(12) United States Patent
Stemmermann

(10) Patent No.: US 12,543,270 B2
(45) Date of Patent: Feb. 3, 2026

(54) METHOD FOR CREATING INTERCONNECTIONS BETWEEN A SUBSTRATE AND ELECTRONIC COMPONENTS

(71) Applicant: SunRay Scientific, Inc., Eatontown, NJ (US)

(72) Inventor: Andrew Stemmermann, Long Branch, NJ (US)

(\*) Notice: Subject to any disclaimer, the term of this patent is extended or adjusted under 35 U.S.C. 154(b) by 0 days.

(21) Appl. No.: 18/108,633

(22) Filed: Feb. 12, 2023

(65) Prior Publication Data

US 2023/0189449 A1    Jun. 15, 2023

Related U.S. Application Data

(62) Division of application No. 16/192,785, filed on Nov. 15, 2018, now Pat. No. 11,606,864.

(60) Provisional application No. 62/586,815, filed on Nov. 15, 2017.

(51) Int. Cl.
  *H05K 3/30*       (2006.01)
  *H05K 13/00*      (2006.01)
  *H05K 13/04*      (2006.01)

(52) U.S. Cl.
  CPC ......... *H05K 3/305* (2013.01); *H05K 13/0015* (2013.01); *H05K 13/0069* (2013.01); *H05K 13/0469* (2013.01); *H05K 2203/0165* (2013.01); *H05K 2203/0195* (2013.01); *H05K 2203/104* (2013.01); *H05K 2203/166* (2013.01)

(58) Field of Classification Search
  CPC .............. H05K 3/305; H05K 13/0015; H05K 13/0069; H05K 2203/104; H05K 2203/166; H05K 3/323; Y10T 29/49133; H01L 24/83
  See application file for complete search history.

(56) References Cited

U.S. PATENT DOCUMENTS

| | | | | |
|---|---|---|---|---|
| 3,775,717 A  * | 11/1973 | Braillon | ............... | B23Q 3/1546 335/295 |
| 4,933,808 A  * | 6/1990 | Horton | ................... | H05K 3/325 361/770 |
| 5,429,701 A | 7/1995 | Lu | | |
| 6,168,442 B1 * | 1/2001 | Naoi | ................... | H01R 13/2414 439/91 |
| 7,601,281 B2 * | 10/2009 | Masaki | ................... | H01L 24/83 264/108 |
| 2005/0039323 A1 | 2/2005 | Sheljaskow | | |
| 2009/0072012 A1 | 3/2009 | Sakaguchi et al. | | |
| 2014/0237815 A1 | 8/2014 | Lau et al. | | |
| 2016/0254244 A1 | 9/2016 | Khanna | | |

OTHER PUBLICATIONS

International Preliminary Report on Patentability, May 19, 2020.

\* cited by examiner

*Primary Examiner* — Donghai D Nguyen
(74) *Attorney, Agent, or Firm* — Capitol Patent & Trademark Law Firm, PLLC

(57) ABSTRACT

Systems and methods for improved interconnections for electronic components using ACAs are provided. The methods involve using magnets specific for each component to be connected and optimized in terms of size and strength and position relative to the substrate and component. Also provided are ovens adapted for use with the methods and systems and kits providing the parts of the system for use with existing ovens.

10 Claims, 4 Drawing Sheets

METHOD FOR CREATING INTERCONNECTIONS BETWEEN A SUBSTRATE AND ELECTRONIC COMPONENTS

CROSS-REFERENCE TO RELATED APPLICATIONS

This is a divisional of U.S. patent application Ser. No. 16/192,785, filed Nov. 15, 2018, which claims benefit of U.S. Provisional Patent Application No. 62/586,815 filed Nov. 15, 2017, the entirety of both of which are incorporated herein by reference.

BACKGROUND

Field of the Invention

This relates generally to establishing electrical connection of components in electronic circuitry. More particularly, this relates to improved methods for connecting components to a substrate using anisotropic conductive adhesives.

Description of Related Art

As the modern demands for technology increase, the number of electronic devices continues to increase, the availability and adoption of such devices continues to increase, the size of such devices continues to decrease, and the number of interconnects of electronic components required to manufacture such devices has vastly increased. Furthermore, in many fields previously analog devices have all but disappeared as such devices have been replaced by electronics, and the size of electronic devices has dropped dramatically, even while the power of those devices has continued to expand rapidly.

As modern components have gotten smaller and more powerful, more circuitry is present on such components in ever-smaller spaces (i.e. the density of the circuitry has increased), with far tighter tolerances between different aspects of e.g. a given chip or component (i.e. the pitch has gotten smaller—"ultra-small pitch").

Modern components are thus often more susceptible to temperature and pressure, either of which may result in problems, and even failure of the component and the entire device of which the component is a part. Unfortunately current means of creating interconnects between e.g. components and their substrates all have limitations and drawbacks for particular applications.

The skilled practitioner will appreciate that there are a number of means of interconnections (such as traditional solder, anisotropic conductive films (ACFs), and anisotropic conductive adhesives (ACAs)) each of which has benefits and limitations, and each of which provides options that may meet the requirements for particular interconnections for particular applications, components, or devices.

Traditional soldering involves exposure of the components being connected to locally high amounts of heat, and pressure. Exposure of such components to these unfavorable or untenable conditions can result in outright failure, poor or unreliable performance or greatly decreased lifetimes.

As one effort at improving interconnects for various applications, ACFs have been developed. These conductive films can reduce the local heat required for connection by soldering, but they can still require significant heat. In addition, both heat and pressure are generally applied to the components, which can be a significant limitation for sensitive components. ACFs also have a limitation with regards to the pitch of interconnections that it is suitable for or can accommodate.

ACAs have also been developed to provide alternative solutions for creating difficult interconnects in particular applications. As with ACFs, these adhesives provide electrical conductivity in the Z-axis only. ACAs such as those produced by SunRay Scientific comprise magnetically-alignable particles that form interconnects among components when the particles are aligned along the Z-axis by exposure to a magnetic field. The adhesive matrix is then cured by e.g. exposure to heat, to complete and fix the interconnection. No pressure is required, making ACAs good candidates for pressure-sensitive components. Further, curing may be accomplished in low heat for temperature sensitive components. Moreover, ACAs allow finer pitch applications than can be achieved using ACFs. Prior art applications of ACAs have generally employed a magnetic field applied across the entire substrate using an electromagnet. While such a field covers all components populated on the substrate, it can be disadvantageous in applications where one or more components on the substrate are sensitive to magnetic field. In addition, the magnetic field applied over the large area includes the entire magnetic field, including flux lines that are not generally very perpendicular to the X-Y plane.

While creating interconnects with ACAs is simple and easy, there is nonetheless a need for improved systems and methods for creating and optimizing interconnects using ACAs in specific applications.

SUMMARY

The inventor has discovered methods that provide unexpected improvements in ACA-based electronic interconnects for specific applications and has developed systems to implement the methods. The methods provide several advantages based on selecting the proper ACA properties, using separate magnets positioned for each component to be interconnected, and selecting the properties of the magnets used for alignment of the ACA for each specific component populated on a substrate to optimize the creation of the Z-axis connections (in terms of the height, number and direction of the Z-axis columns). The methods allow for the construction of what the inventor calls a 'magnetic pallet' that provides consistent and optimal alignment and curing of ACA-based interconnects. The methods can provide improved consistency of interconnects, reduced failures, improved life and increased yields of functional connections, as compared to existing methods of forming interconnects.

In a first aspect, this disclosure provides novel methods of aligning and curing of ACA-based interconnections in digital devices, electronics, and the like. The methods for establishing an interconnect between a substrate and an electronic component populated thereon using a magnetically-alignable anisotropic conductive adhesive (ACA), generally comprise the steps of:
  a) establishing the dimensions and location on the substrate of the first electronic component to be placed on and connected to the substrate;
  b) determining the placement location of the first magnet corresponding to the dimension and location established for the component in step a);
  c) determining the dimensions and strength of the magnet required in step b); and d) mapping the flux lines of the magnetic field for the magnet.

Steps a)-d) are repeated for each additional component to be placed on and connected to the substrate, so as to determine the properties and placement location for each additional magnet needed;

The method further comprises the steps of:
f) creating a magnetic tray and securing each magnet in its respective placement location on the tray;
g) creating an alignment tray and adapting the alignment tray to retain the substrate during alignment and curing;
h) placing the substrate on the alignment tray;
i) applying the ACA to the substrate in a location suitable for interconnecting each component to be placed thereon;
j) populating the substrate with the first component and each additional component where the ACA has been applied;
k) assembling the alignment tray and the magnetic tray;
l) allowing columns to form in the Z-axis in the ACA; and
m) curing the ACA, thereby establishing the interconnects between the substrate and the first component and each additional component.

The alignment tray and the magnetic tray are made of nonmagnetic material. The magnet tray is adapted to receive and retain the first and each additional magnet in their respective placement locations on the tray. The assembled magnet tray (with magnets in place), and the alignment tray (with substrate populated with components and ACA) can be placed as an assembly directly into a curing oven.

In a second aspect, provided herein are systems for creating interconnects between a substrate and electronic components attached thereto using a magnetically-alignable anisotropic conductive adhesive (ACA). The systems generally comprise a magnet tray comprising a nonmagnetic tray adapted to receive and retain each of one or more magnets placed therein in a location that corresponds to the location of one or more electronic components on a substrate to which the components are to be connected.

The systems also comprise an alignment tray adapted to retain a substrate populated with one or more components to be connected thereto with an ACA during alignment and curing of the ACA.

The systems also include an ACA comprising magnetically-alignable particles capable of forming interconnections conductive in the Z-axis.

Both the alignment tray and the magnetic tray are preferably made of nonmagnetic material. If various embodiments, the substrate can only be placed in the alignment tray in one orientation.

In presently preferred embodiments, the magnets are permanent magnets. Generally, for each magnet in the magnet tray, the magnetic flux lines are substantially parallel to each other and substantially perpendicular to the X-Y plane in an area corresponding to the area of the substrate upon which the component and ACA are located. In a presently preferred embodiment, the magnetic flux lines consist essentially of lines parallel to each other and perpendicular to the area of the substrate upon which the component and ACA are located.

In a third aspect, this disclosure provides kit for creating interconnects between a substrate and electronic components attached thereto using a magnetically-alignable anisotropic conductive adhesive. The kits generally comprise:
at least one magnetic tray comprising a nonmagnetic tray adapted to retain one or more magnets in locations corresponding to a desired placement of an electronic component on and connection of the component to a substrate using an ACA;
sufficient magnets to complete the magnet tray, each magnet of a desired size and strength for making an interconnection between the component and the substrate using the ACA;
at least one alignment tray adapted to receive and retain the substrate and components populated thereon during the alignment and curing of the ACA to form the interconnect;
and optionally, an ACA suitable for use with the kit to create at least one interconnect between a component and a substrate using the kit.

In the kits provided, the magnet tray and the alignment tray are configured to be oriented vertically with respect to each other. They are assembled such that an electronic component placed on a substrate (to be connected thereto with an ACA) on the alignment tray is brought into vertical alignment with a magnet on the magnet tray when the magnet tray and the alignment tray are assembled in that manner. Each component requiring a connection (interconnect) has a corresponding magnet with which it will be aligned when the trays are assembled.

In presently preferred embodiments of the kits, the magnets comprise rare earth magnets, or other permanent magnets.

In yet another aspect, this disclosure provides oven systems designed for creating interconnections between a substrate and an electronic component to be placed thereon and connected thereto using an ACA. The oven systems generally comprise a curing oven and one or more shelves or racks each comprising
a magnetic tray fitted with one or more magnets each placed in a location corresponding to the location of an electronic component to be placed on and connected to a substrate using an ACA; and
an alignment tray adapted to receive and retain a substrate populated with one or more components to be placed thereon and connected via an ACA.

These and/or further aspects, features, and advantages of the present invention will become apparent to those skilled in the art in view of this disclosure.

DETAILED DESCRIPTION

Figure 1:
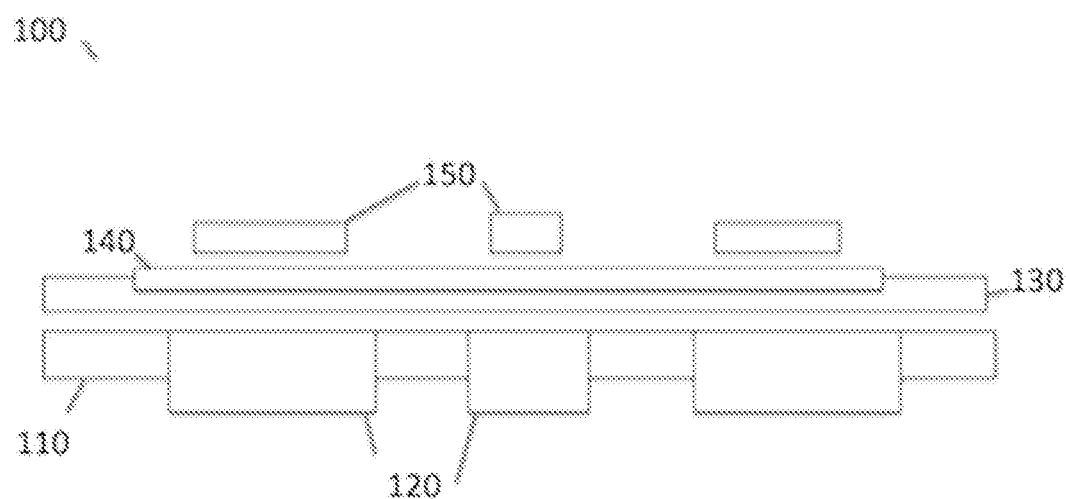
FIG. 1: A cross-sectional overview of an embodiment of the system for magnetically aligning and curing ACA interconnects showing a magnet tray with magnets positioned therein, an alignment tray, substrate and components populated thereon.

Provided herein are methods and systems for providing improved and more consistent interconnections for electronic components using ACAs.

Definitions & Abbreviations

Unless expressly defined otherwise, all technical and scientific terms, terms of art, and acronyms used herein have the meanings commonly understood by one of ordinary skill in the art in the field(s) of the invention, or in the field(s) where the term is used. In accordance with this description, the following abbreviations and definitions apply.

Abbreviations

The following abbreviations apply unless indicated otherwise:
AC: alternating current;
ACA: anisotropic conductive adhesive;
ACF: anisotropic conductive film;
DC: direct current;
Gs: Gauss, magnetic field units;
NIB: neodymium-iron-boron;
PCB: printed circuit board; and
T: Tesla, magnetic field units, SI.

Definitions

As used herein "substantially" may mean an amount that is larger or smaller than a reference item. Preferably substantially larger (or greater) or smaller (or lesser) means by at least about 10% to about 100% or more than the corresponding reference item. More preferably "substantially" in such instances means at least about 20% to about 100%, or more, larger or smaller than the reference item. As the skilled artisan will appreciate the term 'substantially' can also be used as in "substantially all" which mean more than 51%, preferably more than 60%, 67%, 70%, 75%, 80%, 85%, 90%, or more of a referenced item, number, or amount. "Substantially all" can also mean more then 90% including 91, 92, 93, 94, 95, 96, 97, 98, 99 or more percent of the referenced item, number, or amount.

As used herein, the singular form of a word includes the plural, and vice versa, unless the context clearly dictates otherwise. Thus, the references "a", "an", and "the" are generally inclusive of the plurals of the respective terms. For example, reference to "an electrode" or "a diode" includes a plurality of such "electrodes" or "diodes".

The words "comprise", "comprises", and "comprising" are to be interpreted inclusively rather than exclusively. Likewise the terms "include", "including" and "or" should all be construed to be inclusive, unless such a construction is clearly prohibited from the context. Further, forms of the terms "comprising" or "including" are intended to include embodiments encompassed by the phrases "consisting essentially of" and "consisting of". Similarly, the phrase "consisting essentially of" is intended to include embodiments encompassed by the phrase "consisting of".

Where used herein, ranges are provided in shorthand, so as to avoid having to list and describe each and every value within the range. Any appropriate value within the range can be selected, where appropriate, as the upper value, lower value, or the terminus of the range.

The formulations, compositions, methods and/or other advances disclosed here are not limited to particular methodology, protocols, and/or components described herein because, as the skilled artisan will appreciate, they may vary. Further, the terminology used herein is for the purpose of describing particular embodiments only, and is not intended to, and does not, limit the scope of that which is disclosed or claimed.

Although any formulations, compositions, methods, or other means or materials similar or equivalent to those described herein can be used in the practice of the present invention, the preferred formulations, compositions, methods, or other means or materials are described herein.

Any references, including any patents, patent applications, or other publications, technical and/or scholarly articles cited or referred to herein are in their entirety incorporated herein by reference to the extent permitted under applicable law. Any discussion of those references is intended merely to summarize the assertions made therein. No admission is made that any such patents, patent applications, publications or references are prior art, or that any portion thereof is either relevant or material to the patentability of what is claimed herein. Applicant specifically reserves the right to challenge the accuracy and pertinence of any assertion that such patents, patent applications, publications, and other references are prior art, or are relevant, and/or material.

As used herein, "alignment" means aligning a magnetic material or composition comprising magnetic particles. Generally, aligning refers to the arrangement of magnetic particles in the Z-axis under the influence of a magnetic field. Alignment is the process by which columns are formed in the Z-axis. As will be clear from the context, sometimes 'alignment' is also used herein to refer to ensuring the proper orientation of two things with respect to each other-such as the alignment tray and the magnetic tray, or the substrate and the alignment tray.

As used herein, "columns" refers to the structures formed by magnetic particles in a composition in the Z-axis under the influence of a magnetic field. The process of column formation is sometimes referred to as 'alignment'. The column properties (e.g. height, diameter, etc.) will be determined by the strength of the magnets and the properties of the ACA including the size and amount of the magnetic particles in the ACA, and the viscosity and other physical properties of the ACA matrix. Columns can and will form within seconds of exposure to a suitable magnetic field.

A "magnet" is capable of producing a "magnetic field" which as used herein includes any magnetic field whether produced by an electromagnet or a permanent magnet. The "strength" of a magnet can be measured in Gs (or Ts). The skilled artisan will appreciate how to determine the strength of any given magnet, or how to determine the magnetic strength desired for a given magnet. "Mapping a magnetic field" as used herein means determining the specific shape of the magnetic field and path of the magnetic field lines. The skilled artisan will appreciate how to map the magnetic field of any magnet through various means.

As used herein, a "permanent magnet" means a magnet that does not require electrical current to flow in order to have a persistent magnetic field. Permanent magnets for use herein can comprise iron, nickel, cobalt, and rare earth metals. Certain presently preferred embodiments herein utilize rare earth magnets such as those comprising lanthanoid elements. Magnets comprising neodymium, or salts thereof, may be useful herein because of their magnetic strength. In one embodiment, the magnets comprise neodymium, iron, and boron ("NIB magnets"). Samarium, gadolinium, and even dysprosium, and salts thereof may be used for specific applications. Other types of permanent magnets such as ceramic magnets and other composite magnets, and even flexible magnets may be suitable for use herein for other specific applications.

As used herein, an "interconnect" is generally a connection between any two aspects of a system. Interconnect herein generally reflects an electrical connection and a physical connection between e.g. two component or a component and a substrate. "Substrate" is any material used to hold or contain other electronic components connected thereon for use in an electronic system or device, such as a printed circuit board ('PCB'). Substrates can be flexible or rigid. Preferred rigid substrates include e.g. PCBs, composites, and rigid polymers; preferred flexible supports include e.g., flexible polymers.

As used herein, "parallel" means that two lines, such as lines representing magnetic flux are always the same distance apart and never touch each other and exist in the same plane, i.e. they are at 0 degrees with respect to each other. Parallel flux lines herein are generally reference magnetic flux lines in the Z-axis, which are generally perpendicular (i.e. 90 degrees) to the X-Y plane of the substrate. Because of the difficulty of having perfectly parallel flux lines throughout entire applications involving multiple magnets, parallel lines in various embodiments herein may include lines that are "substantially parallel" to each other and/or substantially perpendicular to the X-Y. Such lines may be positioned at e.g. about –30 to about 30 degrees with respect to each other, and/or at about 60 to about 120 degrees with respect to the Z-Y plane. More preferably such lines are positioned at e.g. about –15 to about 15 degrees with respect to each other, and/or about 75 to about 105 degrees with respect to the Z-Y plane. Still more preferably substantially parallel flux lines are positioned at e.g. about –5 to about 5 degrees with respect to each, and/or about 85 to about 95 degrees with respect to the X-Y plane of the substrate. Even more preferably the substantially parallel lines will be positioned within about 0 to about 2 degrees of each other and/or within about 0 to about 2 degrees of perpendicular to the X-Y plane. The skilled artisan will appreciate that the more the magnetic flux lines approximate parallel to each other and perpendicular to the X-Y plane, the more the ACA will form parallel columns during the alignment which will be the basis of the interconnect, and the less shorts and other defects that negatively impact either the functionality or the durability of the interconnects so formed will be present.

As used herein, "Z-axis" means the direction that is perpendicular to the main plane in which the substrate lies, i.e. the X-Y plane.

Detailed Description of Illustrative Embodiments

Systems and methods for creating improved and more consistent electronic interconnects with ACAs in electronic circuits are provided herein. Such systems generally comprise individual magnets placed in a location corresponding to each component being connected. The size and strength of each magnet is determined based on the component, the substrate, the ACA in use, and the application in question. Only components being connected with the ACA are exposed to any magnetic field, meaning sensitive components are not exposed to unneeded magnetic fields. Preferably, the optimized interconnects provide better yields, less shorts and other failures, and longer lifetimes/more cycles. The inventors have surprisingly discovered that by employing strategic selection of magnet size, strength, and placement, the consistency and quality of interconnects can be substantially improved. Thus, disclosed herein are methods and systems for improving the creation of interconnects using ACAs.

In a first aspect this disclosure provides novel methods of aligning and curing ACA-based interconnections in digital devices, circuit boards, electronics, and the like. The methods for establishing an interconnect between a substrate and an electronic component populated thereon using a magnetically-alignable anisotropic conductive adhesive (ACA), generally comprise the steps of:

a) establishing the dimensions and location on the substrate of the first electronic component to be placed on and connected to the substrate;

b) determining the placement location of the first magnet corresponding to the dimension and location established for the component in step a);

c) determining the dimensions and strength of the magnet required in step b); and d) mapping the flux lines of the magnetic field for the magnet.

Steps a)-d) are repeated for each additional component to be placed on and connected to the substrate, so as to determine the properties and placement location for each additional magnet needed. The skilled artisan will appreciate that throughout the specification there are various methods set forth in set herein wherein various steps are set forth. It should be noted that wherever such steps are not strictly required to be performed in the stated order, the methods can equally be performed by conducting the steps in a different order as best facilitates the achievement of successful interconnections without changing the overall purpose and result.

The method further comprises the steps of creating a magnetic tray and securing each magnet in its respective placement location on the tray; and creating an alignment tray and adapting the alignment tray to retain the substrate during alignment of the ACA in the Z-axis (i.e. column formation) and curing.

The substrate is then placed on the alignment tray. The ACA is applied to the substrate where the components will be placed. The substrate is then populated with the first and each additional component.

The alignment tray (including the substrate, components to be attached, and the applied ACA) and the magnetic tray are assembled to expose the ACA to the magnets. Sufficient exposure time is provided allowing columns to form in the Z-axis in the ACA; and the ACA is then cured, thereby establishing interconnects between the substrate and the first and each additional component.

Generally, the alignment tray and the magnetic tray are made of nonmagnetic material, such as aluminum or thermostable materials, such as plastics or composites. The magnet tray is generally adapted to receive the first and each additional magnet in their respective placement locations on the tray. The completed assembly comprising the magnet tray with magnets, and the alignment tray with substrate populated with components and ACA can be placed in a curing oven.

In various embodiments, the magnets comprise permanent magnets. The magnets comprise rare earth magnets in one presently preferred embodiment. Rare earth magnets comprising neodymium or NIB magnets are used in one embodiment.

The inventor has discovered that the size and strength of the magnets for creating interconnections can be determined empirically for each application to optimize the consistency and quality of the interconnects formed. The skilled artisan will appreciate that selecting the size and strength of a particular magnet will relate to the process of column formation, and the magnet selection will be influenced by the desired properties of the columns, such as height, diameter, and the strength of the column. Moreover the connections of the column to both the component and the substrate are influenced by the magnet properties as well.

Thus, in certain embodiments, the size and strength of the magnets are determined to optimize or address the attributes of the column or the final interconnects. Such attributes may include the height of the columns, the interconnection strength, the number of resultant shorts, the expected lifetime of the completed device or board, the yield of usable product, or the failure rate or number of rejects resulting from the process of creating the interconnections.

The inventor has also determined that distinct benefits arise from utilizing magnetic flux lines that are substantially parallel to each other and/or substantially perpendicular to the X-Y plane in an area corresponding to the area of the substrate upon which the component and ACA are located. In various embodiments the magnetic flux lines consist essentially of such parallel and/or perpendicular lines.

In various embodiments, the ACA forms substantially uniform columns in terms of height and diameter as a result of utilizing the methods provided. In presently preferred embodiments, the ACA forms substantially uniform columns that are substantially perpendicular to the X-Y plane of the component and the substrate.

To optimize the method further, further improve consistency and to make the method more foolproof, in one embodiment the geometry of portion of the alignment tray that accommodates and/or retains the substrate is configured so that the substrate can only be placed in the alignment tray in one orientation. This enables a technician to reproducibly place the substrate in the alignment tray for production.

In other embodiments, the alignment tray comprise alignment means such as placement pins, complementary structure, or the like to ensure the magnetic tray and the alignment tray can only be assembled in the proper orientation with respect to each other. Alternatively, the geometry of the alignment and magnetic trays only allows assembly in one (proper orientation). The skilled artisan will appreciate that there are a number of simply ways to provide for proper orientation. Again, such features will further increase consistency and allow any technician to use the method for production.

As discussed above, generally, the methods allow an assembly comprising the positioned magnet tray and alignment tray to be placed directly into a curing oven. Preferably the alignment tray and the magnet tray comprise materials that can withstand curing conditions for curing the ACA. In one embodiment the trays are aluminum or thermostable, nonmagnetic materials that can withstand e.g. 50-70 C, 60-80 C, 70-100 C, 75-120 C, 100-140 C, or even greater temperatures. It is expected that lower temperature curing methods will continue to be developed, in which case the materials used to the alignment and magnet trays can be revised accordingly.

Figure 2:
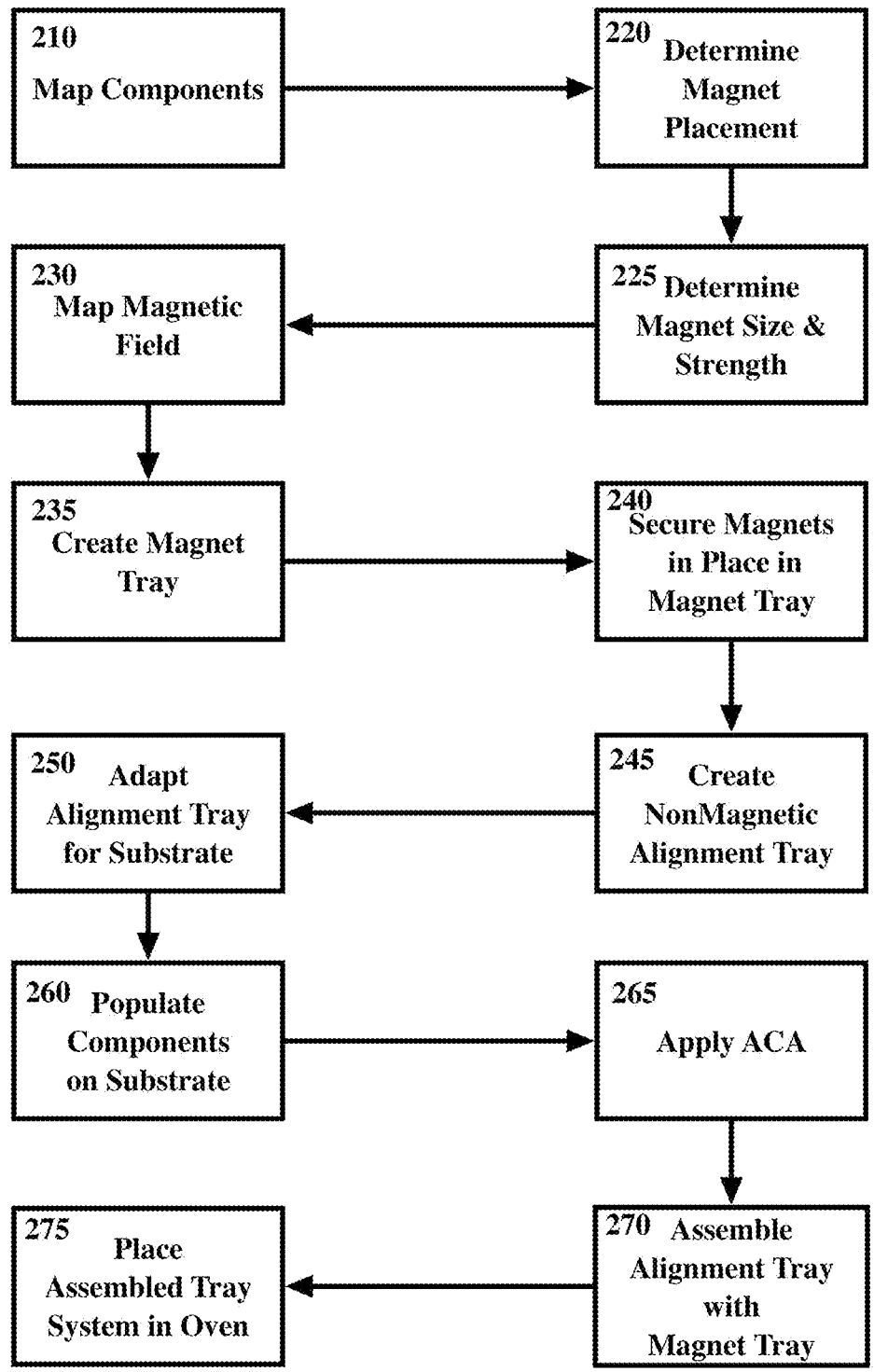
FIG. 2: A flow chart showing the steps of a method of magnetically aligning and curing components to substrate using an ACA to create the electrical connection.

The methods can be more fully appreciated by reference to the figures. FIG. 2 shows a flow chart for one embodiment 200 of the methods described herein. As can be seen the methods generally start with an understanding of the substrate and the components to be placed thereon and connected thereto using the ACA as noted in step 210. The dimensions and location of each component can be mapped out to allow the design of a magnet tray and a determination of the placement location 220 of each magnet required.

The size and strength of each magnet can be determined 225 based on the specifics of the application. The properties of the magnetic field, e.g. the magnetic flux lines for each magnet can be determined or mapped out 230. The skilled artisan will understand how to determine the size, strength, and magnetic flux lines for each magnet required. The skilled artisan will also appreciate that order of the foregoing steps may be altered as might be preferable in a given application.

The skilled artisan will further appreciate that the properties of the magnet(s) will influence the development and formation of the columns in the Z-axis within the ACA. Stronger magnets will allow higher columns that form faster, however it is not desirable to have the magnet be too strong. In various embodiments, the ideal properties of the magnets are determined empirically for any given application.

A magnet tray is created 235 and the magnets selected for the job are secured in their respective locations 240. It is understood that the magnet tray is designed to accommodate each of the magnets in its respective locations by any useful means that does not alter the position or magnetic field of the magnet with respect to the component and substrate. In one embodiment, the magnetic tray is made of aluminum with holes cut out at the locations where each of the magnets is to be placed. The magnets may be secured in place 240 by any means again provided it does not alter the strength or flux lines of the magnet. Adhesives can be conveniently used to secure the magnets in the magnet tray in certain embodiments.

An alignment tray is created 245 to serve as a carrier for the substrate and components and to ensure the substrate and each component populated thereon aligns with the corresponding magnet in the magnet tray. The alignment tray is adapted 250 to receive and retain the substrate during the alignment of the ACA and the subsequent curing. The tray can be adapted by any mean to secure the substrate during the process of creating the interconnections. In one embodiment a recessed area complementary to the shape of the substrate is created to receive and restrain the substrate passively during the process. In a presently preferred embodiment, the substrate can only be received in one orientation in the alignment tray, thereby minimizing the risk of misalignment with the magnets in the magnet tray.

The ACA is applied 265 to the substrate at the locations where the components will be placed 260. In some embodiments contemplated herein the steps may vary, e.g. the components may be populated and the ACA may be applied at the same time. The skilled artisan will also appreciate the order of operation here may so vary provided the end result is that each component is correctly placed on the substrate in the desired location with the desired amount of ACA in between the two.

The alignment tray and the magnet tray are then brought into proximity with each other. In a presently preferred embodiment, the trays must be brought into alignment while positioned vertically with respect to each. This is enforced by structure which prevent sliding the alignment tray with the substrate across the magnetic fields of the magnets in the magnet tray and initiating improper column formation. By requiring the magnet tray and the alignment tray to be brought into proximity in this fashion, the column formation is optimized and restricted to substantially the Z-axis. The thus assembled trays 270 (the 'assembly' or magnet pallet assembly) can be then be placed in an oven for curing under appropriate conditions. Because the assembled trays fit together in a manner that optimizes formation of Z-axis (i.e. perpendicular) columns that are parallel to each other and because the assembly can be moved without substantially interfering with the columns, the oven may be a batch oven wherein the assemblies are manually moved in and out of the oven, or it may be a semicontinuous or even continuous over, such as a reflow oven wherein the assemblies travel along a conveyor through the oven. After the ACA has cured there is little risk of impacting the column structure; i.e. the columns are stable in the cured ACA.

It should also be noted that a phenomenon referred to herein as 'chip flipping' can occur with certain components. If a component is magnetically polar—i.e. if the component has e.g. two separated magnetic poles, when exposed to the magnetic field of the magnet tray the component will 'flip' to align itself with the magnetic field. Because the ACA is not yet aligned or cured when the system is exposed to the magnet tray, there is nothing to prevent the chip(s) from doing so. In extreme cases the component could be pulled entirely from the substrate. While this only happens with certain components, if present it poses a problem. The inventor has developed a simple solution to solve this issue if such a component is present. It requires including an additional 'tacking' step to secure the component/chip prior to exposure to the magnet tray. Generally, the components of concern are secured to the substrate. One useful way is to apply a small amount of epoxy to hold the susceptible component in place in the presence of the magnetic field. Present methods include the use of UV-curable epoxy applied as a dab sufficient to secure the component, followed by a brief exposure to UV light of sufficient intensity and duration to ensure the epoxy is cured. The assembly of substrate, component, and ACA can then be placed in proper proximity to the magnet tray to allow the Z-axis columns to form without concerns regarding components/chips flipping.

In a second of its several aspects, this disclosure provides systems for creating interconnects between a substrate and electronic components attached thereto using a magnetically-alignable anisotropic conductive adhesive (ACA). The system comprises a magnet tray comprising a nonmagnetic tray adapted to receive and retain each of one or more magnets placed therein in a location that corresponds to the location of one or more electronic components on a substrate to which the components are to be connected.

The system also comprises an alignment tray adapted to receive a substrate populated with one or more components to be connected thereto with an ACA. The alignment tray can retain the substrate during the alignment and curing of the ACA.

The system also comprises an ACA comprising magnetically-alignable particles capable of forming interconnections conductive in the Z-axis. The ACA formulation can be varied for specific applications as may be dictated by the electronic components or the nature of the device for which components are being interconnected. ACAs may be formulated with e.g. different sized electromagnetic/conductive particles for applications having different pitch requirements.

In presently preferred embodiments, the alignment tray and the magnetic tray are made of nonmagnetic material. In one embodiment the substrate can only be placed in the alignment tray in one orientation to avoid confusion and mistakes and to allow nontechnical staff to assist with production.

Generally, the magnet tray and the alignment tray are adapted to be arranged together vertically in removable fashion such that the components on the substrate are vertically aligned with the magnets in the magnet tray and the ACA is exposed to the magnetic field such that the flux lines are substantially perpendicular to an X-Y plane defining the substrate. Such arrangement is preferably maintained until curing of the ACA is complete.

In various embodiments of the system the magnets are permanent magnets. Rare earth magnets are useful for many applications herein, including magnets that comprise neodymium, such as NIB magnets. These magnets can provide a strong magnetic field.

An assembly comprising the magnet tray, the alignment tray, and the substrate populated with components can be placed directly into a curing oven in one embodiment. This enables the aligned ACA to be cured with minimal movement and little risk of disturbing the columns formed in the Z-axis upon exposure to the magnetic field. In another embodiment the assembly and/or the magnet tray serves as a rack that can slide into the oven directly and does not requires any supporting shelf or additional rack for use. In other embodiments, the assembly can be placed on a conveyor mechanism for use with a semicontinuous or continuous process oven. In such embodiments the conveyor may include a multitude of different assemblies with the same of different configurations of substrates and components—each matched with its own magnetic tray designed according to the specifics and the components and substrate to be interconnected.

In various embodiments for each magnet in the magnet tray of the system, the magnetic flux lines are substantially parallel to each other and substantially perpendicular to the X-Y plane in an area corresponding to the area of the substrate upon which the component and ACA are located. Optimal interconnections can arise from such arrangements. The ACA forms substantially uniform columns which are substantially perpendicular to the X-Y plane of the component and the substrate in various embodiments.

With further reference to the figures, FIG. 1 depicts an embodiment 100 of the system for magnetically aligning and curing ACA interconnects illustrating certain features of the system. Shown is a cross-sectional view of an embodiment for magnetically aligning and curing ACA interconnects showing a nonmagnetic magnet tray 110 with a plurality of magnets 120 positioned therein. The magnet tray 110 has openings (not numbered for convenience and clarity) to accommodate the magnets 120, which may be secured in the magnet tray 110 using adhesive (not shown) or other means of securing that do not alter the magnetic flux lines or otherwise interfere with the magnets 120. An alignment tray 130 has a recess that receives the substrate 140 which is retained in place during the alignment and curing of the ACA to form the interconnects. Substrate 140 has a plurality of electronic components 150 positioned thereon. ACA (not shown) is applied/positioned (or likely has been applied) between the components 150 and the substrate 140. As can be seen, the placement of each of magnets 120 corresponds to the location of component 150 on substrate 140 so that the magnets 120 are vertically aligned with the components 150. In this configuration the magnetic field provides the force to align electromagnetic particles of the ACA (not shown) to form the Z-axis column. As can be seen, the area covered by each of magnets 120 is larger than the area covered by the corresponding component 150, such that the system 100 provides more optimal and consistent alignment as compared to prior art electromagnets that cover the entire surface of the substrate, or magnets that are the same size as the component.

Figure 3:
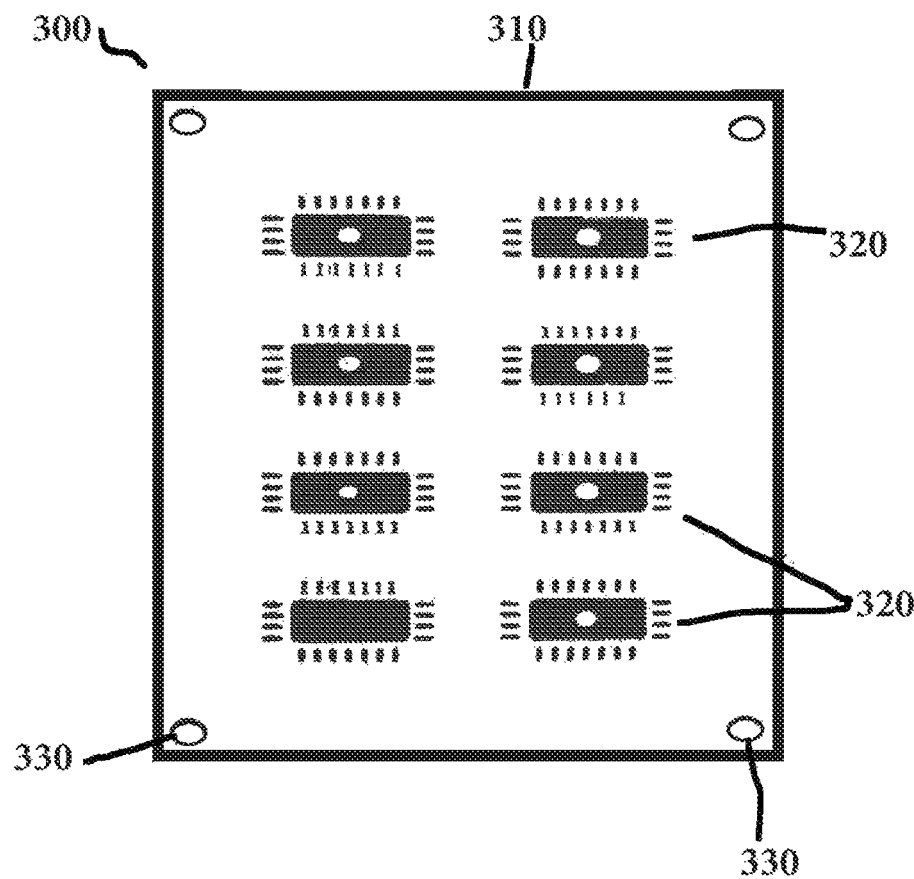
FIG. 3: A drawing showing an embodiment of an alignment tray for use herewith. The tray contains a plurality of substrates each with a populated component to be placed on and connected to the substrate.

FIG. 3 depicts an embodiment of an alignment tray 300 illustrating various aspects thereof. The single tray 310 depicted comprises a plurality of substrates (not shown), each having a single component 320. In other embodiments (not shown) depending on the size, a single alignment tray may hold a single substrate with one or more components. The presence of alignment means 330 are holes in this embodiment allow for proper alignment using e.g. pins or rods, with a magnet tray (not shown) such that the magnet tray and alignment tray are vertically arranged and the magnets in the magnet tray are aligned with the corresponding component to be interconnected to the substrate on the alignment tray. Because proper alignment is important to successful formation of interconnects, in various embodiments the alignment trays may include simple features e.g., varying hole geometry, hole patterns or offsets, differing hole size, a combination of holes and pins, along with complementary structures in the magnet tray to ensure the alignment tray and the magnet tray can only be aligned in a single orientation with respect to each other. The skilled artisan will appreciate that there are many art recognized methods for achieving proper alignment between two such objects.

In yet another aspect, the disclosure provides kits for creating interconnects between a substrate and electronic components attached thereto using a magnetically-alignable anisotropic conductive adhesive. The kits generally comprise:

at least one magnetic tray comprising a nonmagnetic tray adapted to retain one or more magnets in locations corresponding to a desired placement of an electronic component on and connection of the component to a substrate using an ACA;

sufficient magnets to complete the magnet tray, each magnet of a desired size and strength for making an interconnection between the component and the substrate using the ACA; and at least one alignment tray adapted to receive and retain the substrate and components populated thereon during the alignment and curing of the ACA to form the interconnect.

Optionally, the kits further comprise an ACA suitable for use with the kit to create interconnects between components and the substrate using the kit.

The magnet tray and the alignment tray are generally configured to be oriented vertically with respect to each other and can be assembled such that an electronic component placed on a substrate on the alignment tray is brought into vertical alignment with a magnet on the magnet tray when the magnet tray and the alignment tray are so oriented and assembled. This configuration is used for both the alignment and curing process in various embodiments.

In a presently preferred embodiment the oriented and assembled magnet tray and alignment tray ("the assembly") can be placed into a curing oven. In one embodiment, the magnet tray or the assembled trays function as a rack in the oven, or a rack for conveying into a semicontinuous or continuous oven such as a reflow oven, or a curing tunnel.

In various embodiments, when the magnet tray and alignment tray are assembled together, for each magnet in the magnet tray, the magnetic flux lines are substantially parallel to each other and substantially perpendicular to the X-Y plane in an area corresponding to the area of the substrate upon which the component is located. Generally, an ACA positioned between the substrate and a component thereon forms substantially uniform columns that are substantially perpendicular to the X-Y plane of the component and the substrate when the trays are oriented and assembled.

In a still further aspect, the disclosure provides oven systems for creating interconnections between a substrate and an electronic component to be placed thereon and connected thereto using an ACA. The systems operate generally as described above for other systems described herein and in accordance with the methods. Generally the oven systems comprise a curing oven and one or more shelves or racks each comprising a magnetic tray fitted with one or more magnets each placed in a location corresponding to the location of an electronic component to be placed on and connected to a substrate using an ACA; and an alignment tray adapted to receive and retain a substrate populated with one or more components to be placed thereon and connected via an ACA.

The magnets in one embodiment are permanent magnets. Rare earth magnets are useful for many applications herein, including magnets that comprise neodymium, such as NIB magnets.

In various embodiments of the oven systems, for each magnet in the magnet tray of the system, the magnetic flux lines are substantially parallel to each other and substantially perpendicular to the X-Y plane in an area corresponding to the area of the substrate upon which the component and ACA are located. The ACA forms substantially uniform columns, which are substantially perpendicular to the X-Y plane of the component and the substrate in various embodiments.

Figure 4:
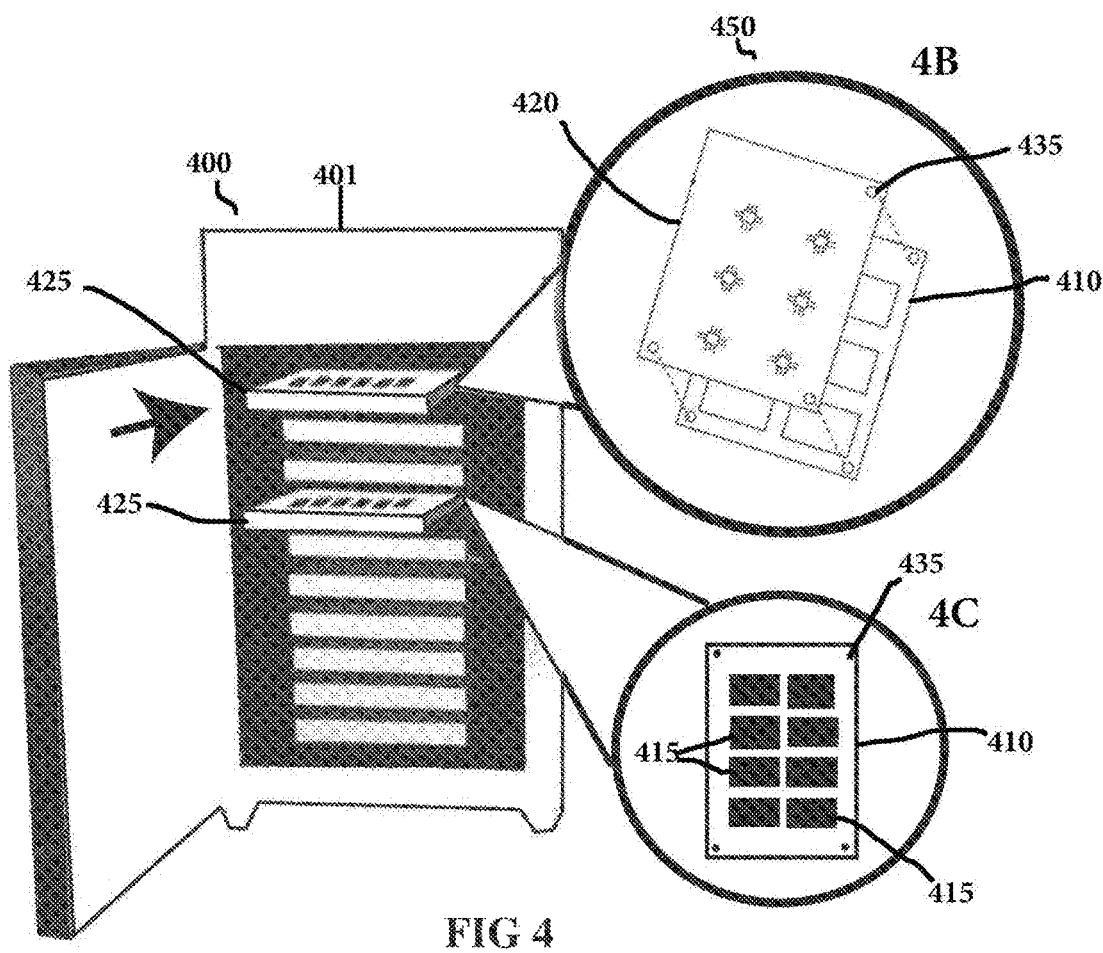
FIG. 4: A drawing showing an embodiment of an oven employing the magnetic pallet system. A. Multiple magnet tray and alignment tray assemblies are shown in a batch oven. The outside dimensions of the alignment and magnet trays are dictated by the oven dimensions but there is otherwise no requirement that each magnet tray or each alignment tray be identical. Thus, a single oven can be utilized to align and cure a multitude of interconnects for a plurality of electronic components on different substrates or devices. B. Shows a magnified view of an assembly comprising an alignment tray and a magnet tray with the orientation means (alignment holes). C. A close-up overhead view of a magnet tray that serves as a rack in the oven.

An embodiment 400 of the oven system is shown in FIG. 4. As can be seen each assembly 450 of a magnet tray 410 and an alignment tray 420 can serve as a rack 425 in the batch oven 401 which is generally designed to accommodate a plurality of such racks 425. A magnified view of an assembly 450 is shown as inset FIG. 4B, which comprises an assembled magnet tray 410 and alignment tray 420 retaining the substrate, components and the ACA (generally, 430) during alignment of the columns in the Z-axis, and throughout the curing process. The alignment holes 435 ensure that the assembly can only be put together in the proper orientation. Inset FIG. 4C, shows a separate magnet tray 410 showing a plurality of permanent magnets 415 in place.

The scope of the invention is set forth in the claims appended hereto, subject, for example, to the limits of language. Although specific terms are employed to describe the invention, those terms are used in a generic and descriptive sense and not for purposes of limitation. Moreover, while certain presently preferred embodiments of the claimed invention have been described herein, those skilled in the art will appreciate that such embodiments are provided by way of example only. In view of the teachings provided herein, certain variations, modifications, and substitutions will occur to those skilled in the art. It is therefore to be understood that the invention may be practiced otherwise than as specifically described, and such ways of practicing the invention are either within the scope of the claims, or equivalent to that which is claimed, and do not depart from the scope and spirit of the invention as claimed.

What is claimed is:

1. A method of establishing an interconnect between a substrate and an electronic component populated thereon using a magnetically-alignable anisotropic conductive adhesive (ACA), the method comprising the steps of:

a) establishing dimensions and location on the substrate of a first component to be placed on and connected to the substrate;
b) determining placement location of a first magnet corresponding to the dimensions and location established for the component in step a);
c) determining dimensions and strength of the first magnet in step b);
d) mapping flux lines of the magnetic field for the first magnet;
e) repeating steps a)-d) for each additional component to be placed on and connected to the substrate to determine properties and placement location for each additional magnet;
f) creating a magnetic tray and securing each magnet in the respective placement location on the tray;
g) creating an alignment tray and adapting the alignment tray to retain the substrate during alignment and curing;
h) placing the substrate on the alignment tray;
i) applying the ACA on the substrate in one or more locations where components are to be placed;
j) populating the substrate with the first and each of the additional components;
k) assembling the alignment tray and the magnetic tray;
l) Allowing columns to form in the Z-axis in the ACA; and
m) curing the ACA, thereby establishing the interconnects between the substrate and the first and each of the additional components;
  wherein the alignment tray and the magnetic tray are made of nonmagnetic material and the magnet tray is adapted to receive the first and each of the additional magnets in their respective placement locations on the tray; and
  wherein an assembly comprising the magnet tray with magnets, the alignment tray with substrate populated with components and ACA can be placed in a curing oven.

2. The method of claim 1 wherein the magnets comprise permanent magnets.

3. The method of claim 2 wherein the magnets comprise rare earth magnets.

4. The method of claim 3 wherein a size and strength of each magnet is independently and empirically determined to optimize height of the columns, to optimize the interconnection strength, to decrease a number of shorts, to increase the expected lifetime of the completed device or board, to increase yield of usable product, or to decrease failures or rejects as a result of creating the interconnections.

5. The method of claim 4 wherein for each magnet in the magnet tray, the magnetic flux lines are substantially parallel to each other and substantially perpendicular to the X-Y plane in an area corresponding to the area of the substrate upon which the component and ACA are located.

6. The method of claim 1 wherein the ACA forms substantially uniform columns in terms of height and diameter.

7. The method of claim 1 wherein the ACA forms substantially uniform columns, which are substantially perpendicular to the X-Y plane of the component and the substrate.

8. The method of claim 1 wherein the substrate can only be placed in the alignment tray in one orientation.

9. The method of claim 1 wherein the alignment tray comprise alignment means to ensure the magnetic tray and the alignment tray can only be assembled in a proper orientation with respect to each other.

10. The method of claim 1 wherein the alignment tray and the magnet tray comprise materials that can withstand curing conditions for curing the ACA.

* * * * *